(12) United States Patent
Lan et al.

(10) Patent No.: US 9,184,942 B2
(45) Date of Patent: Nov. 10, 2015

(54) AUTOMATIC GAIN CONTROL IN A COMMUNICATIONS SYSTEM

(75) Inventors: Cheng-Chou Lan, Los Angeles, CA (US); Cimarron Mittelsteadt, Santa Clarita, CA (US)

(73) Assignee: ViXS Systems, Inc., Toronto, Ontario (CA)

( * ) Notice: Subject to any disclaimer, the term of this patent is extended or adjusted under 35 U.S.C. 154(b) by 376 days.

(21) Appl. No.: 13/346,055

(22) Filed: Jan. 9, 2012

(65) Prior Publication Data

US 2013/0177112 A1    Jul. 11, 2013

(51) Int. Cl.
| | | |
|---|---|---|
| H04L 27/08 | (2006.01) | |
| H04L 25/02 | (2006.01) | |
| H04L 5/00 | (2006.01) | |
| H04L 25/03 | (2006.01) | |
| H03G 3/30 | (2006.01) | |
| H04L 27/26 | (2006.01) | |
| H04L 1/00 | (2006.01) | |
| H04L 1/20 | (2006.01) | |

(52) U.S. Cl.
CPC ............ *H04L 25/022* (2013.01); *H03G 3/3068* (2013.01); *H03G 3/3078* (2013.01); *H04L 5/006* (2013.01); *H04L 5/0046* (2013.01); *H04L 25/03159* (2013.01); *H04L 1/0057* (2013.01); *H04L 1/20* (2013.01); *H04L 27/2657* (2013.01); *H04L 27/2662* (2013.01); *H04L 2025/03414* (2013.01)

(58) Field of Classification Search
CPC ......................................................... H03M 1/00
USPC ......................................................... 375/345
See application file for complete search history.

(56) References Cited

U.S. PATENT DOCUMENTS

| | | | | |
|---|---|---|---|---|
| 6,122,331 | A * | 9/2000 | Dumas .......................... | 375/345 |
| 8,095,856 | B2 * | 1/2012 | Wang ............................ | 714/784 |
| 8,149,967 | B2 * | 4/2012 | Umari et al. ................. | 375/345 |
| 2005/0220208 | A1 * | 10/2005 | Aoki .............................. | 375/267 |
| 2008/0232518 | A1 * | 9/2008 | Kim et al. ..................... | 375/345 |
| 2010/0177857 | A1 * | 7/2010 | Huttunen et al. ............. | 375/350 |

OTHER PUBLICATIONS

CTE Implication Paper, "The Challenges and Rewards of MoCA Deployment for the Home Network," An Implication paper prepared for the Society of Cable Telecommunications Engineers by Spirent Communications, http://mocalliance.org/marketing/white_papers/Spirent_white_paper.pdf, pp. 1-29, downloaded Aug. 30, 2011.

(Continued)

*Primary Examiner* — Lihong Yu
(74) *Attorney, Agent, or Firm* — Abel Law Group, LLP

(57) ABSTRACT

An automatic gain control technique generates one or more gain control signals based on a known sequence of samples received in a preamble of a packet received over a particular communications link and generates one or more adjusted gain control signals based on a previously unknown sequence of samples received in a payload of a packet. In at least one embodiment of the gain control technique, time domain samples of the preamble of a symbol are used to generate the one or more gain control signals. In at least one embodiment of the gain control technique, frequency domain samples are used to generate the one or more adjusted gain control signals. The one or more gain control signals include digital and/or analog gain control signals that are provided to digital signal processing modules and/or analog circuits in an interface circuit, respectively, to adjust the gain applied to a received signal.

20 Claims, 12 Drawing Sheets

(56) References Cited

OTHER PUBLICATIONS

Ovadia, Shlomo, "Home Networking on Coax for Video and Multimedia," Overview for IEEE 802.1AVB, Multimedia over COAX Alliance, May 30, 2007, pp. 1-15.

Rosu, Iulian, "Automatic Gain Control (AGC) in Receivers," YO3DAC/VA3IUL—http://www.qsl.net/va3iu1/, 9 pp., downloaded Aug. 30, 2011.

\* cited by examiner

US 9,184,942 B2

AUTOMATIC GAIN CONTROL IN A COMMUNICATIONS SYSTEM

BACKGROUND

1. Field of the Invention

The present invention relates to communications systems, and more particularly, to automatic gain control in communications systems.

2. Description of the Related Art

In a typical communications system, receiver circuitry introduces noise into a received signal. For example, thermal noise, shot noise, blackbody noise, flicker noise, and other unwanted signal sources contribute to the noise floor of the receiver. If a receiver receives a small signal (i.e., a signal that has levels in a range close to the noise floor of the receiver), the received signal that is processed by the system will have a low signal-to-noise ratio, which results in unreliable data recovery and low performance (e.g., low bit error rate) of the communications system. If the receiver receives a large signal (i.e., a signal that has levels in a range close to the maximum level of the dynamic range of the receiver), saturation and/or clipping distortion may occur and result in unreliable data recovery and low performance of the communications system. Accordingly, typical receivers apply gain to the received signal prior to processing the received signal. In addition, individual receiver modules may introduce noise or distortion into the received signal during processing of the received signal. If the noise level increases without corresponding increases to the signal level, the signal-to-noise ratio of the signal decreases, which decreases performance of the receiver. Techniques for maintaining a particular signal-to-noise ratio in a receiver include applying gain to the received signal at one or more locations in the received signal path to maintain, at a target level, the voltage level of a received signal with respect to the dynamic range of the receiver modules to thereby facilitate achieving a target system performance.

SUMMARY OF EMBODIMENTS OF THE INVENTION

In at least one embodiment of the invention, a method includes receiving a payload portion of a received packet based on a gain control signal having a first value. The method includes selectively adjusting the gain control signal to have a second value. The second value is based on the payload portion of the received packet. In at least one embodiment, the method includes generating the first value based on a preamble portion of a second received packet. In at least one embodiment of the method, generating the first value includes determining the first value based on time domain samples of the preamble portion of the second received packet. In at least one embodiment, the method includes determining the second value based on a frequency domain symbol of the payload portion of the received packet.

In at least one embodiment of the invention, a receiver includes a receiver interface circuit, a gain generation circuit, and a selection circuit. The gain generation circuit is configured to generate a gain signal having a first value based on a preamble portion of a packet received using the receiver interface circuit. The gain generation circuit is configured to generate the gain signal having a second value based on a payload portion of a second packet received using the receiver interface circuit. The selection circuit is configured to provide the first gain value to the receiver interface circuit in response to an indicator of a first set of one or more conditions and configured to provide the second gain value in response to an indicator of a second set of one or more conditions.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An automatic gain control technique generates one or more gain control signals based on a known sequence of samples received in a preamble of a packet received over a particular communications link and generates one or more adjusted gain control signals based on a previously unknown sequence of samples received in a payload of a packet. In at least one embodiment of the gain control technique, time domain samples of the preamble of a symbol are used to generate the one or more gain control signals. In at least one embodiment of the gain control technique, frequency domain samples are used to generate the one or more adjusted gain control signals. The one or more gain control signals include digital and/or analog gain control signals that are provided to digital signal processing modules and/or analog circuits in an interface circuit, respectively, to adjust the gain applied to a received signal.

Figure 1:
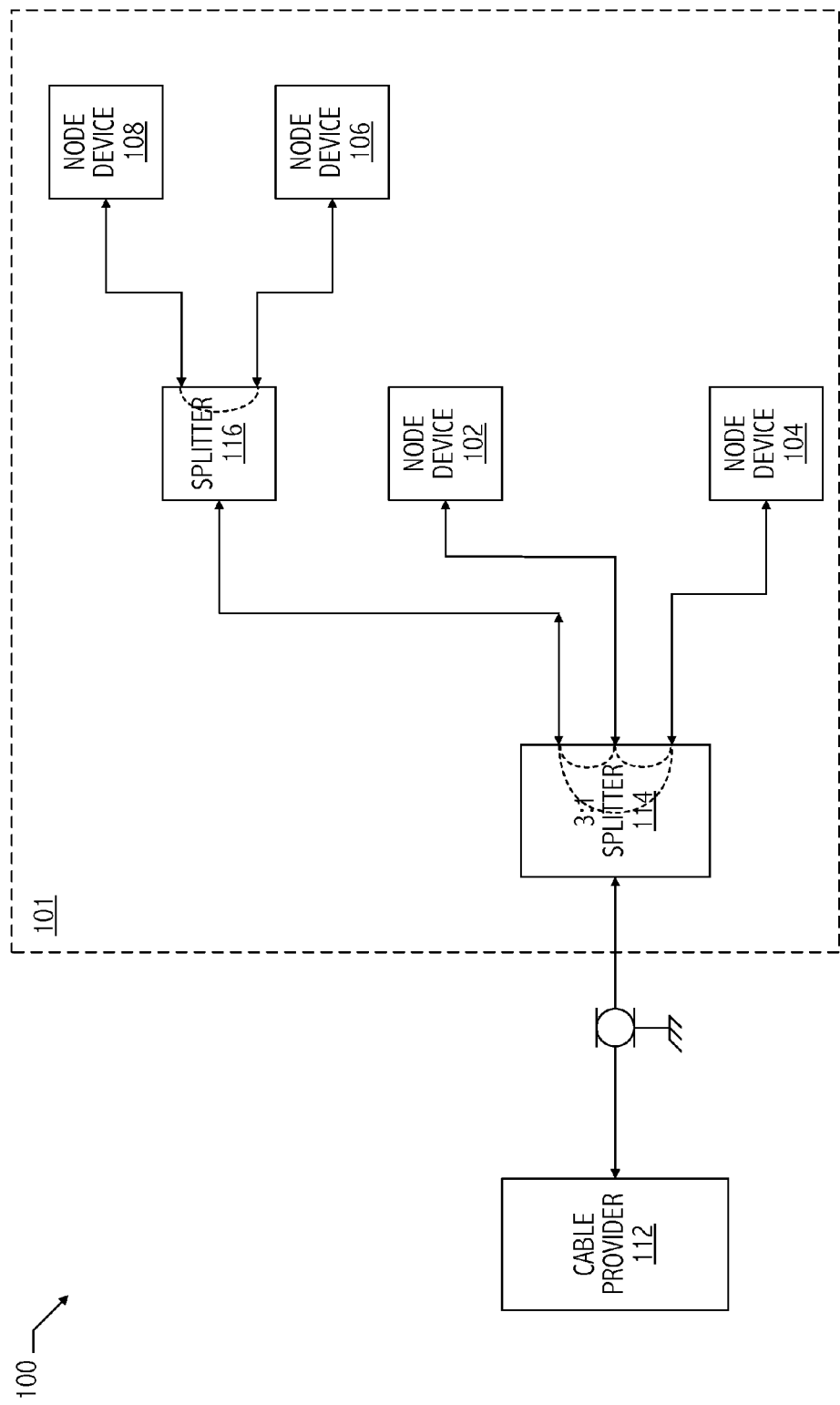
FIG. 1 illustrates a functional block diagram of an exemplary communications network.

Referring to FIG. 1, in an exemplary digital communications network (e.g., network 100) nodes (e.g., nodes 102, 104, 106, and 108) and splitters (e.g., splitters 114 and 116) are configured as a local area network (e.g., network 101) using communications over a channel (e.g., coaxial cables). In at least one embodiment of network 100, nodes 102, 104, 106, and 108 communicate with a wide-area network (e.g., cable provider 112) via splitter 114 and/or splitter 116. In addition, in at least one embodiment of network 100, nodes 102, 104, 106, and 108 communicate with each other via splitter jumping.

Figure 2:
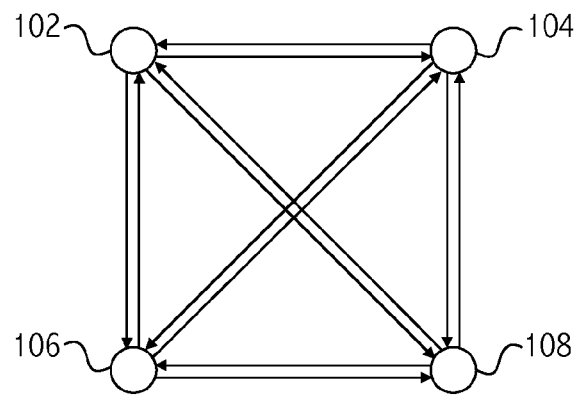
FIG. 2 illustrates an exemplary logical topology of node devices of the communications network of FIG. 1.

Note that due to effects of splitter jumping and reflections at different terminations of network 101, channel characteristics (e.g., attenuation and delay) for a link between two nodes may be different from the channel characteristics for a link between two other nodes. In addition, channel characteristics in a forward path may be different from channel characteristics in a reverse path. Thus, channel capacity between each source node and destination node varies from the channel capacity for two other source nodes and destination nodes. Accordingly, to appropriately use the channel capacity of network 101, individual nodes of network 101 determine and store suitable separate physical (PHY) parameters tailored for each link (i.e., store separate PHY profiles for each link). Referring to FIG. 2, a logical model of network 101 is a fully-meshed collection of point-to-point links Each link has unique channel characteristics and capacity. In addition to point-to-point communications, network 101 supports broadcast and multicast communications in which a source node uses a common set of PHY parameters that may be received by all destination nodes.

In at least one embodiment of network 101, nodes 102, 104, 106, and 108 share a physical channel. Thus, only one node is allowed to transmit at a particular time. For example, the physical channel is time division-multiplexed and coordinated by a Media Access Control (MAC) data communication protocol sublayer using time division multiple access (TDMA). In at least one embodiment, network 101 is a centrally coordinated system with one node being a network-coordinator (NC). A node that is the NC transacts data on the network like any other node, but is also responsible for transmitting beacons to advertise network presence and timing, coordinating a process for admitting nodes to the network, scheduling and coordinating transmission of data among all nodes in the network, scheduling and coordinating link-maintenance operations (e.g., operations during which nodes update their physical profiles), and other functions.

In at least one embodiment of node 102, a cyclic prefix is concatenated with modulated symbols to form an Adaptive Constellation Multi-tone (ACMT) symbol. For example, one ACMT symbol is formed by copying and prepending a number of last samples (i.e., cyclic prefix samples ($N_{CP}$)) of an inverse first Fourier transform (IFFT) output (N samples), resulting in an output symbol having $N+N_{CP}$ samples. Multiple ACMT symbols are concatenated to form a packet. In general, a receiver is configured to discard the cyclic prefix samples. However, the cyclic prefix serves two purposes. First it serves as a guard interval that reduces or eliminates intersymbol interference from a previous symbol. Secondly, the cyclic prefix facilitates modeling linear convolution of a frequency-selective multipath channel as circular convolution, which in turn may be transformed to the frequency domain using a discrete Fourier transform. This approach allows for simple frequency-domain processing, such as for channel estimation, equalization, and demapping and recovery of the transmitted data bits. The length of the cyclic prefix is chosen to be at least equal to the length of the multipath channel.

Figure 3:
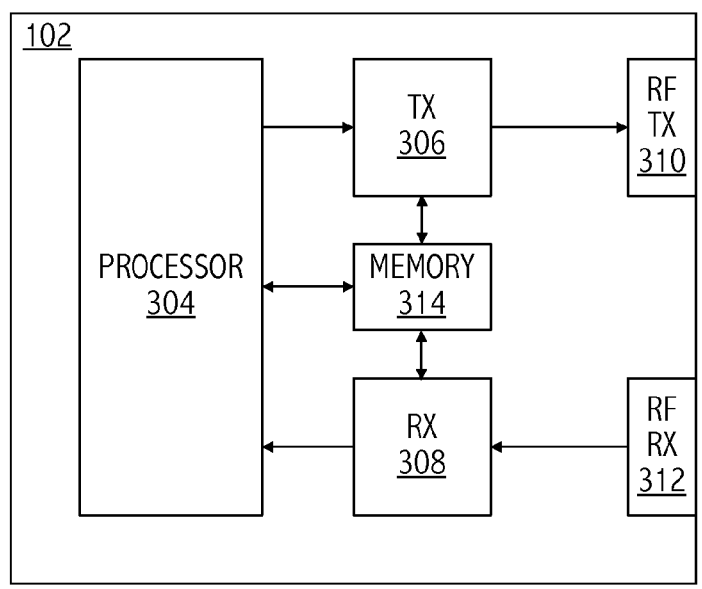
FIG. 3 illustrates a functional block diagram of an exemplary node device of the communications network of FIG. 1.

Referring to FIG. 3, an exemplary node 102 includes a processor configured to generate and process data communicated over network 101. Data to be transmitted over the network is digitally processed in transmitter 306 (e.g., using memory 314) and transmitted over the channel using RF transmitter 310. In at least one embodiment, node 102 includes a radio frequency receiver configured to receive analog signals over the channel and to provide a baseband analog signal to the receiver path (e.g., receiver 308), which digitally processes the baseband signal (e.g., using memory 314) to recover data and control information symbols and provide it to processor 304.

In at least one embodiment, node 102 implements orthogonal frequency division multiplexing (OFDM). In general, OFDM is a frequency-division multiplexing scheme utilized as a digital multi-carrier modulation method in which a large number of orthogonal subcarriers having closely-spaced frequencies are used to carry data. The data is divided into several parallel data streams or channels (i.e., frequency bins or bins), one for each subcarrier. Each subcarrier is modulated with a conventional modulation scheme (e.g., quadrature amplitude modulation or phase shift keying) at a low symbol rate, maintaining total data rates similar to conventional single-carrier modulation schemes in the same bandwidth. In at least one embodiment of node 102, the physical interface (e.g., transmitter 306 and receiver 308) utilizes Adaptive Constellation Multi-tone (ACMT), i.e., node 102 pre-equalizes modulation to the frequency response of each link using bit loaded OFDM. In addition, channel profiling techniques tailor the modulation for each link. In at least one embodiment of node 102, physical layer channels are approximately 50 MHz wide (i.e., the ACMT sampling rate is approximately 50 MHz) and the total number of OFDM subcarriers is 256. However, other sampling rates and numbers of subcarriers may be used. In at least one embodiment of node 102, due to DC and channel edge considerations, only 224 of the 256 subcarriers are available for typical communications.

In at least one embodiment of node 102, a modulation profile is generated based on probe packets sent between nodes and analyzed at the receiving nodes. After analysis, a receiving node assigns numbers of bits to subcarriers for a particular link and communicates this information to node 102. An individual ACMT subcarrier may be active or inactive (i.e., turned off). An active ACMT subcarrier is configured to carry one to eight bit Quadrature Amplitude Modulation (QAM) symbols. In at least one embodiment of node 102, transmit power of a sending node is dynamically adjusted based on modulation profiling using the probe packets and based on link performance.

In general, the channel is time-varying and link maintenance operations (LMOs) facilitate the recalculation of PHY parameters. Thus, at regular intervals a transmitting node sends one or more probe packets which are received and analyzed by receiving nodes. The receiving nodes send back probe reports to the corresponding transmitting nodes. Those probe reports may include updated parameters. In at least one embodiment of node 102, each probe packet includes a preamble and a payload. In at least one embodiment of node 102, multiple probe types are used for characterization of different network elements. In at least one embodiment of node 102, probe and/or payload packets include a preamble that includes one or more symbols used for channel estimation.

Figure 4:
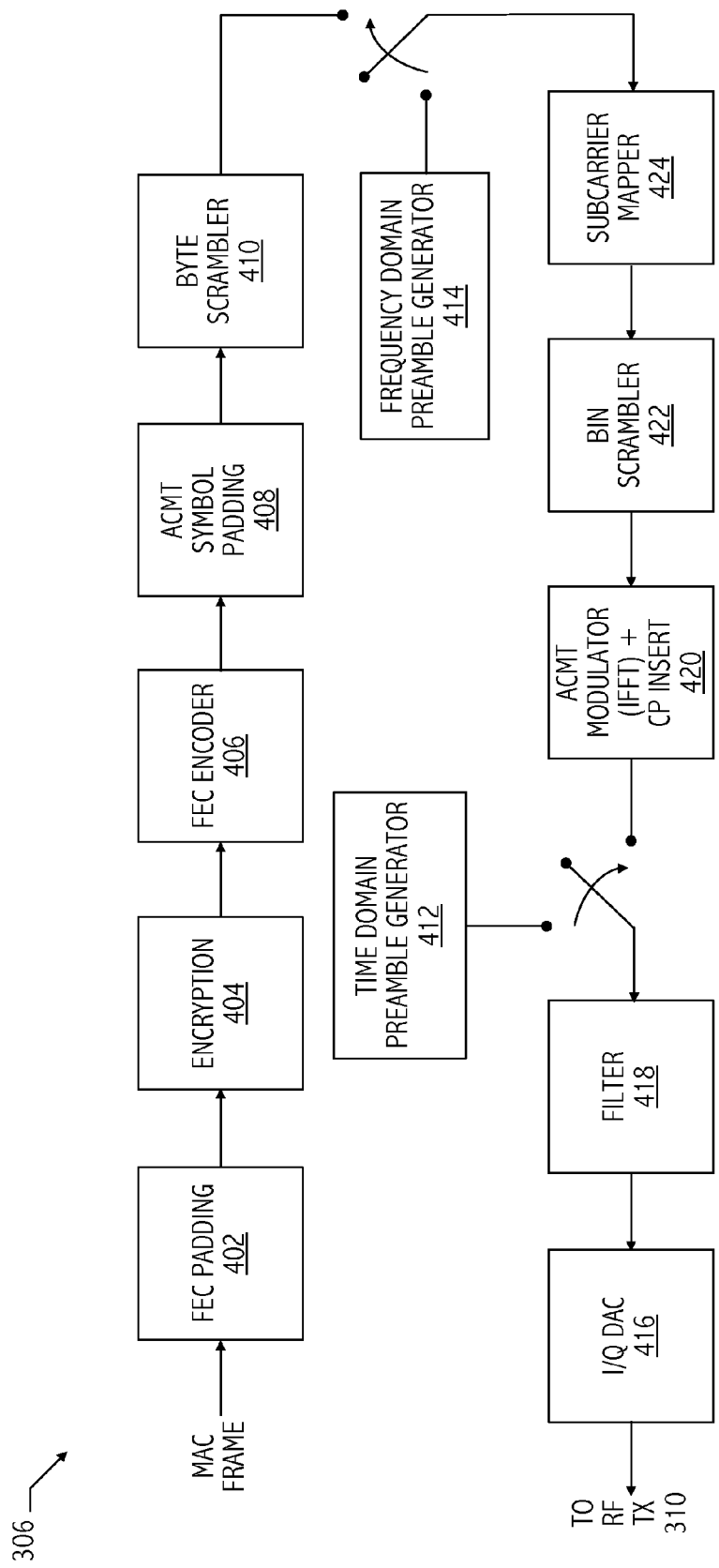
FIG. 4 illustrates a functional block diagram of an exemplary transmitter path of the node device of FIG. 3 consistent with at least one embodiment of the invention.

Referring to FIG. 4, in at least one embodiment, transmitter 306 receives a frame of data from a Medium Access Control data communication protocol sub-layer (i.e., MAC layer). In at least one embodiment of transmitter 306, a channel coding module (e.g., FEC padding module 402) pads bytes so that the FEC encoder receives the required number of bits. In at least one embodiment of transmitter 306, an encryption module (e.g., encryption module 404) encrypts the frame to deter eavesdropping and provide link layer privacy. In at least one embodiment, encryption module 404 implements 56 bit Data Encryption Standard (DES) encryption using a privacy key generated and received from the NC. However, in other embodiments of transmitter 306, other encryption techniques may be used.

In at least one embodiment of transmitter 306, an encoder (e.g., forward error correction (FEC) encoder 406) encodes the frame using up to two different Reed-Solomon block sizes. All codewords except the last are coded with the maximum Reed-Solomon block size, while the last block may be coded using a shorter block size to reduce the FEC padding. FEC encoder 406 encodes the frame with redundancies using a predetermined algorithm to reduce the number of errors that may occur in the message and/or allow correction of any errors without retransmission. Note that in other embodiments of transmitter 306, other types of forward error correction are used (e.g., other block codes or convolutional codes). In at least one embodiment of transmitter 306, a padding module (e.g., ACMT symbol padding module 408) inserts additional bits into the data to form symbols having a particular ACMT symbol size. In at least one embodiment of transmitter 306, a scrambler module (e.g., byte scrambler 410) scrambles each transmitted data byte to change the properties of the transmitted data stream. For example, byte scrambler 410 facilitates data recovery by reducing dependence of the signal power spectrum on the actual transmitted data and/or reducing or eliminating occurrences of long sequences of '0' or '1' that may otherwise cause saturation of digital circuitry and corrupt data recovery. In at least one embodiment of transmitter 306, an ACMT subcarrier mapping module (e.g., subcarrier mapper 424) maps bits of data to ACMT subcarriers according to a predetermined bit loading profile (e.g., a bit loading profile received from a receiving node and stored in memory). In at least one embodiment of transmitter 306, the predetermined profile is selected from a plurality of predetermined profiles according to a particular mode or packet type (e.g., beacon mode, diversity mode, Media Access Plan (MAP), unicast, or broadcast) and link for transmission (e.g., a profile stored for a particular receiving node).

In at least one embodiment of transmitter 306, a scrambler module (e.g., bin scrambler 422) scrambles the data of the ACMT subcarriers to change the properties of the transmitted data stream (e.g., reduce dependence of the signal power spectrum on the actual transmitted data or to reduce or eliminate occurrences of long sequences of '0' or '1') to properties that facilitate data recovery. A modulator (e.g., ACMT modulator 420) generates the time domain in-phase and quadrature (i.e., I and Q) components corresponding to the OFDM signal. ACMT modulator 420 includes an N-point IFFT and inserts a cyclic prefix to the modulated data (i.e., inserts the cyclic prefix to time domain symbols). For example, ACMT modulator 420 copies the last $N_{CP}$ samples of the IFFT output (e.g., N samples) and prepends those samples to the IFFT output to form an OFDM symbol output (e.g., $N+N_{CP}$ samples). The cyclic prefix is used as a guard interval to reduce or eliminate intersymbol interference from a previous symbol and also to facilitate linear convolution of the channel to be modeled as a circular convolution, which may be transformed to the frequency domain using a discrete Fourier transform. This approach allows for simple frequency-domain processing, such as for channel estimation, equalization, and demapping and recovery of transmitted data. The length of the cyclic prefix is chosen to be at least equal to the length of the multipath channel. In at least one embodiment of transmitter 306, filter 418 limits the frequency band of the signal to a signal having a particular spectral mask prior to digital-to-analog conversion (e.g., by digital-to-analog converter 416) and any frequency modulation to a higher frequency band (e.g., from baseband to one of four frequency bands in the range of 850 MHz to 1525 MHz at 25 MHz increments) for transmission.

Depending upon a particular communication type, in at least one embodiment of transmitter 306, frequency domain preamble generator 414 or time domain preamble generator 412 inserts a preamble into the packet prior to processing a MAC frame of data. For example, rather than processing a MAC frame through the portion of the transmitter path including FEC padding module 402, encryption module 404, FEC encoder 406, ACMT symbol padding module 408, and byte scrambler 410, an alternate source (e.g., frequency domain preamble generator 414) provides a plurality of frequency domain preamble symbols, including one or more frequency domain symbols (e.g., which are generated or retrieved from a storage device) to subcarrier mapper 424. Subcarrier mapper 424 maps bits of those frequency domain preamble symbols to individual subcarriers. Those frequency domain preamble symbols are then processed by the remainder of transmitter 306 (e.g., bit scrambled, ACMT modulated, filtered, and converted to an analog signal) and sent to RF TX 310 for transmission. The frequency domain preamble symbols provide a reference signal that may be used by the receiver for timing and frequency offset acquisition, receiver parameter calibration, and PHY payload decode. In at least one embodiment of transmitter 306, frequency domain preamble generator 414 provides a plurality of channel estimation frequency domain symbols (e.g., two channel estimation symbols) to other portions of transmitter 306 (e.g., subcarrier mapper 424, ACMT modulator 420, filter 418, and DAC 416). In at least one embodiment of transmitter 306, time domain preamble generator 412 inserts a plurality of time domain symbols directly to filter 418 for digital-to-analog conversion and then transmission over the link. The time domain preamble symbols provide a reference signal that may be used by the receiver to identify packet type and for symbol timing and frequency offset acquisition.

Figure 5:
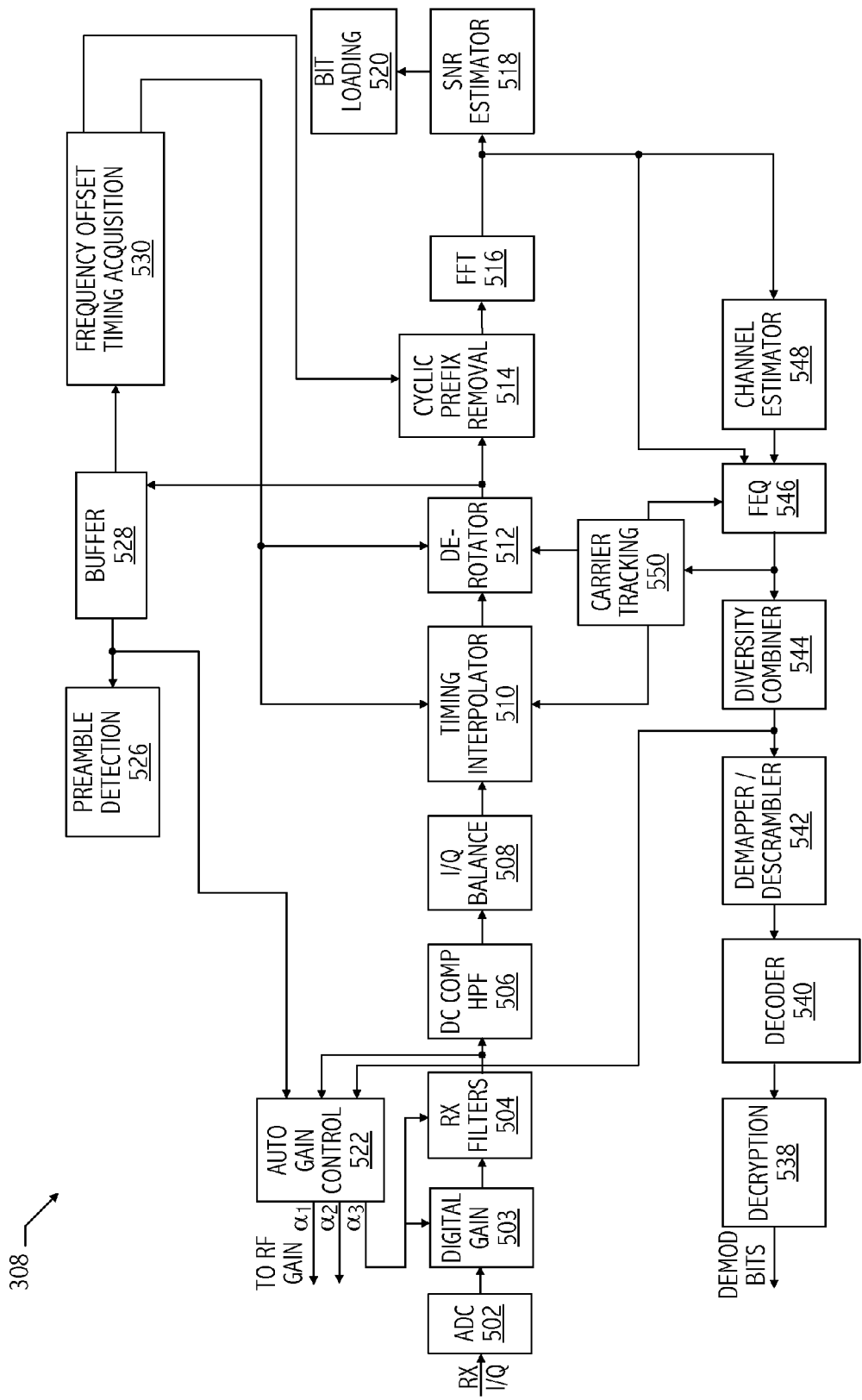
FIG. 5 illustrates a functional block diagram of an exemplary receiver path of the node device of FIG. 3 consistent with at least one embodiment of the invention.

Referring to FIG. 5 in at least one embodiment, receiver 308 receives an analog signal from the RF receiver interface (e.g., RF receiver 312 of FIG. 3) and analog-to-digital converter (e.g., ADC 502) converts in-phase and quadrature analog signal components of the received signal into a complex digital signal. Referring back to FIG. 5, in at least one embodiment of receiver 308, one or more filters (e.g., RX filters 504) limit the complex digital signal to a baseband signal having a particular bandwidth. In at least one embodiment of receiver 308, one or more other filters (e.g., high-pass filter 506) attenuates or removes a DC component of the complex digital signal. In at least one embodiment of receiver 308, I/Q balance module 508 adjusts the real and imaginary components of the complex baseband signal, which are balanced at the transmitting node, but become unbalanced after transmission over the channel by analog circuitry and due to any imbalance introduced by RF receiver 312. I/Q balance module 508 adjusts the in-phase and quadrature components of the complex baseband signal to have approximately the same gain and/or phase. In at least one embodiment of receiver 308, a timing module (e.g., timing interpolator module 510) adjusts the sample timing based on a timing offset, e.g., by using a delay filter to interpolate samples and generate an output sample having a particular timing based on the timing offset. In at least one embodiment of receiver 308, a frequency offset correction module (e.g., de-rotator module 512) compensates for any frequency offset e.g., by performing a complex multiply of the received data with a complex data value based on a previously determined target angle of rotation that compensates for the frequency offset. In at least one embodiment of receiver 308, a module (e.g., cyclic prefix removal module 514) strips a number of samples (e.g., $N_{CP}$ samples, where $N_{CP}$ is the number of samples inserted by the transmitter as the cyclic prefix) from the de-rotated data symbol and provides the resulting time domain symbol to a demodulator (e.g., fast Fourier transform (FFT) module 516), which generates frequency domain symbols.

In at least one embodiment of receiver 308, during channel estimation sequences (e.g., during receipt of symbols of a probe signal) a signal-to-noise ratio (SNR) estimator (e.g., SNR estimator 518) generates an SNR estimate based on multiple frequency domain symbols. A bit loading module (e.g., bit loading module 520) assigns a number of bits for transmission over individual subcarriers of the OFDM channel based on the SNR estimate. For example, bit loading module 520 turns off an individual subcarrier or assigns a one to eight bit QAM symbol to the individual subcarrier. In general, bit loading module 520 generates a bit allocation for each subcarrier of an OFDM signal and receiver 308 communicates those bit loading assignments to a transmitting node for a particular link for generating packets for communication during data communications intervals. In addition, the resulting bit loading is stored in receiver 308 for data recovery during subsequent communications sequences.

In at least one embodiment of receiver 308, during data demodulation and decode sequences, a frequency domain equalizer (e.g., FEQ 546) reduces effects of a bandlimited channel using frequency domain equalizer taps generated by a channel estimation module (e.g., channel estimator 548), as described further below. In at least one embodiment of receiver 308, during data demodulation and decode sequences that communicate in a diversity mode (e.g., a mode in which the same signal is transmitted by multiple subcarriers) diversity combiner module 544 combines signals repeated on multiple subcarriers into a single improved signal (e.g., using a maximum ratio combining technique). In at least one embodiment of receiver 308, frequency domain symbols are demapped from the subcarriers and descrambled (e.g., using demapper/descrambler module 542) according to a technique consistent with the mapping and scrambling technique used on a transmitting node. The demapped and descrambled bits are decoded (e.g., using decoder 540) consistent with coding used by a transmitting node. A decryption module (decryptor 538) recovers demodulated bits and provides them to a processor for further processing.

In at least one embodiment of receiver 308, carrier tracking module 550 uses a pilot subcarrier ($n_P$) that carries known training data to synchronize the frequency and phase of the receiver clock with the transmitter clock. A typical pilot tone transmitted from the source node has only a real component (i.e., the imaginary component is zero), and the imaginary part of the complex output of subcarrier $n_P$ from the FFT is input to a feedback loop on the receiver. That feedback loop is configured to adjust the receive clock signal to drive to zero the recovered imaginary part of the pilot tone. The imaginary part of the complex output of subcarrier $n_P$ from the FFT is input to a loop filter, which via a digital-to-analog converter delivers a digital control signal to de-rotator 512 and timing interpolator 510. However, in other embodiments of receiver 308, the output of the loop filter is a control voltage that is provided to a VCXO that adjusts the frequency of the receive clock. In at least one embodiment of receiver 308, rather than dedicating one or more subcarriers to being pilot tones that carry known data, a carrierless tracking technique is used to generate an indicator of frequency offset that is used to adjust the frequency of the receive clock.

In general, FEQ 546 reduces effects of the bandlimited channel by equalizing the channel response. In at least one embodiment of receiver 308, a payload packet received over a particular link includes a preamble portion that includes one or more symbols for channel estimation. A typical channel estimation symbol is generated at a transmitting node associated with the particular link using a pseudorandom number generator, obtained from a storage device, or generated using another suitable technique. In at least one embodiment of receiver 308, channel estimator 548 estimates the channel response based on received channel estimation symbols. Channel estimator 548 determines frequency domain equalizer coefficients for the link based on that estimated channel response (i.e., channel response estimate) and provides the frequency domain equalizer coefficients to FEQ 546 for use during data demodulation and decode sequences.

In a typical OFDM system, a transmitter oscillator frequency and subcarrier frequencies are related by integers. A technique for synchronizing subcarriers at the receiver to subcarriers generated at a transmitting node uses at least one frequency offset determination during an acquisition interval (e.g., coarse and fine frequency offset determinations). For example, a coarse frequency offset determination technique may resolve frequency offsets greater than ½ of the subcarrier spacing, and fine frequency offset determinations may resolve offsets up to ½ of the subcarrier spacing. In at least one embodiment of receiver 308, frequency offset and timing acquisition module 530 performs both coarse frequency acquisition and fine frequency acquisition to determine timing offsets and frequency offsets using known sequences received as part of a packet preamble. The coarse and fine frequency acquisition techniques use known symbols and require channel stationarity for the corresponding time interval. However, once the preamble of a packet is over, slight changes in the overall system may result in additional frequency offset. Accordingly, a carrier tracking module (e.g., carrier tracking module 550) implements a decision-directed, frequency tracking technique to determine frequency offsets for reliable data demodulation that compensates for the time-varying nature of carriers to achieve and maintain a target system performance level (e.g., target bit-error rate).

In at least one embodiment of receiver 308, during timing and frequency acquisition sequences, a gain control module (e.g., automatic gain control module 522, described further below) provides power adjustment control signals to monotonically adjust analog gain of the RF receiver interface (e.g., RF receiver 312 of FIG. 3) using adjustments in a particular range and step size. Referring back to FIG. 5, in at least one embodiment of receiver 308, during timing and frequency acquisition sequences, the output of de-rotator 512 is stored in a storage device (e.g., buffer 528). The stored data is used to detect a preamble of a packet (e.g., using preamble detection module 526). In at least one embodiment, a frequency offset and timing acquisition module (e.g., frequency offset and timing acquisition module 530) generates an indication of a start of a symbol and an indication of a frequency offset for use by the receiver for recovery of subsequent received symbols (e.g., timing interpolator 510, de-rotator 512, and cyclic prefix removal module 514).

Figure 6:
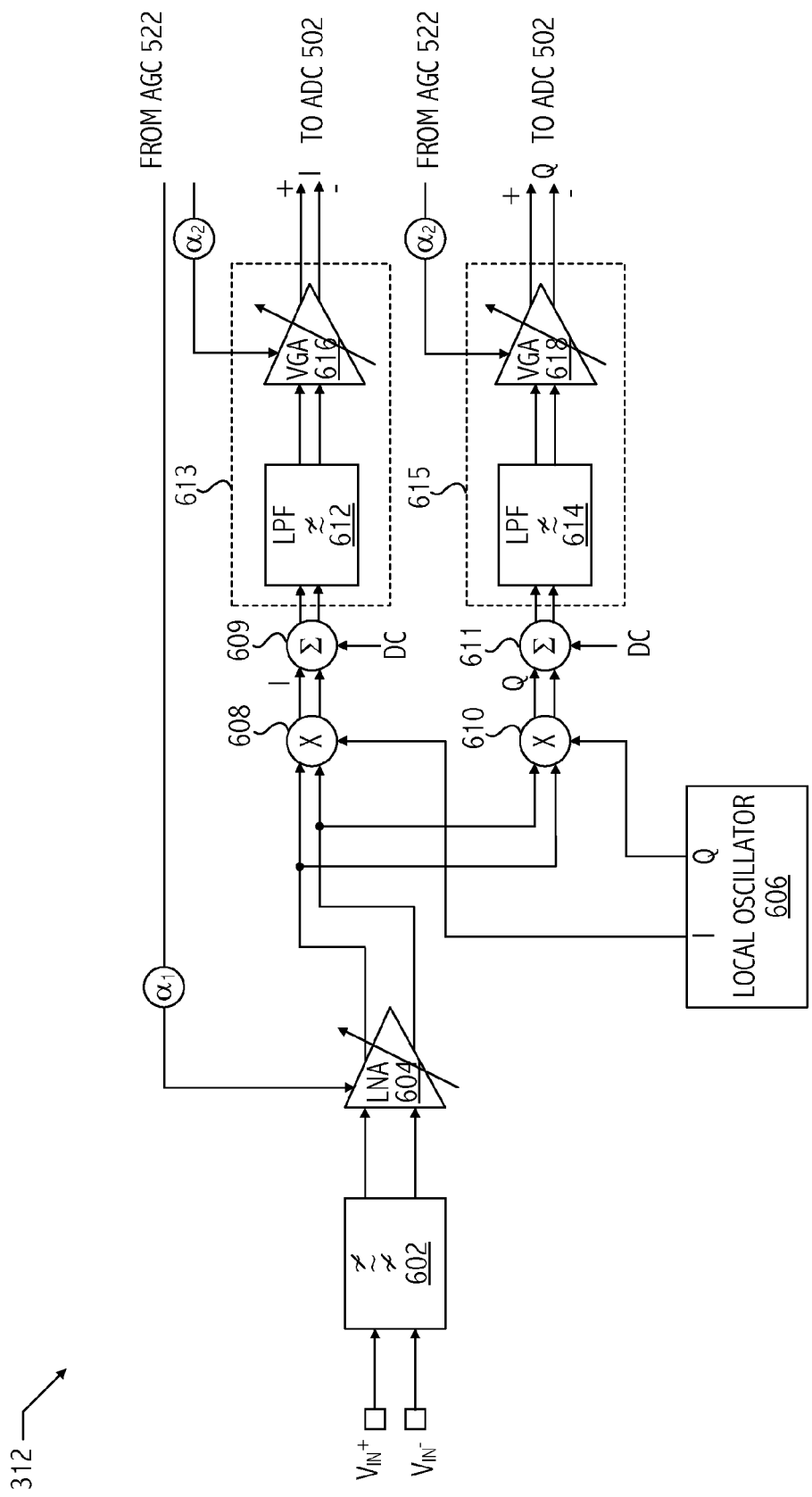
FIG. 6 illustrates a functional block diagram of the receiver interface of FIG. 3, consistent with at least one embodiment of the invention.

Referring to FIGS. 3 and 6, an exemplary receiver interface circuit (i.e., analog front end or receiver front end, e.g., RF receiver 312) receives, over a channel, a signal (e.g., a radio frequency signal having energy in one of four frequency bands in the range of 850 MHz to 1525 MHz at 25 MHz increments, or other suitable frequency band). For example, a balun converts a signal received over a coaxial cable to a differential signal, which is received on terminals $V_{IN}^+$ and $V_{IN}^-$ of RF receiver 312. A filter (e.g., bandpass filter 602) limits the spectrum of the received signal to a frequency band of interest and provides the bandlimited version of the received signal to a low-noise amplifier (e.g., low-noise amplifier 604). In general, the overall noise figure of a receiver front end is dominated by the first few stages. Low-noise amplifier 604 reduces the effects of noise from subsequent stages of RF receiver 312 by the gain of low-noise amplifier 604, although noise from low-noise amplifier 604 is injected directly into the received signal. Accordingly, low-noise amplifier 604 is an amplifier configured to amplify possibly very weak signals. Therefore, low-noise amplifier 604 has very high amplification in its first stage and is able to boost the signal power (e.g., 20 dB) while adding relatively little noise and distortion (e.g., low-noise amplifier 604 has a noise figure in the range of 0.5 dB to 2 dB) so that retrieval of the signal is possible in later stages of the receiver. Low-noise amplifier 604 has a variable gain, which is adjusted based on a control signal (e.g., $\alpha_1$) that is provided to low-noise amplifier 604 from an automatic gain control module (e.g., AGC 522 of FIG. 5).

Referring back to FIG. 6, in at least one embodiment of RF receiver 312, the received signal is frequency modulated from a radio frequency band of interest to baseband, e.g., using a frequency mixer (e.g., multipliers 608 and 610). Multipliers 608 and 610 perform a complex multiply of the received signal with a locally-generated, sinusoidal signal (e.g., a signal generated by local oscillator 606) having a frequency that corresponds to the system carrier frequency to generate in-phase and quadrature components of the received signal at a baseband bandwidth. In at least one embodiment of RF receiver 312, the mixing of the received signal at the carrier frequency with the local oscillator signal shifts the frequency band of the signal down to baseband, resulting in a DC component. In an embodiment of an analog-to-digital converter (e.g., ADC 502, which may be included in RF receiver 312 or in receiver 308 of FIG. 5) a DC component of the signal reduces the dynamic range of the analog-to-digital converter. Accordingly, summers 609 and 611 combine the outputs of multipliers 608 and 610 with a DC signal that reduces or eliminates any DC component of the received signal.

Filters 613 and 615 reduce or eliminate any high frequency noise (i.e., unwanted signals outside the baseband) from the energy of the received signal. In addition, in some embodiments of RF receiver 312, filters 613 and 615 also amplify the signal to a level suitable for processing by ADC 502. For example, in at least one embodiment of RF receiver 312, filters 613 and 615 are variable gain programmable filters that perform the filtering and amplification functions using a single, integrated module. In other embodiments of RF receiver 312, separate low-pass filters 612 and 614 and variable gain amplifiers 616 and 618 perform the filtering and amplification functions serially.

Referring to FIGS. 5 and 6, since the channel associated with a particular link can vary from the channel associated with another link, RF receiver 312 adaptively adjusts a gain applied to the received signal to achieve received signal levels in a target range for signals received over that particular link. To sufficiently detect strong signals (i.e., signals that are received at voltage levels close to a maximum of the dynamic range of RF receiver 312) in addition to weak signals (i.e., signals that are received at voltage levels just above the noise floor of RF receiver 312) with little or no distortion, the gain of the receiver path including RF receiver 312 and receiver 308 is adjusted as early as possible in RF receiver 312 and based on the received signal voltage level. Accordingly, at least one module of RF receiver 312 applies a variable gain to the received signal that is adjusted based on at least one corresponding gain control signal received from an automatic gain control module (e.g., AGC 522). In at least one embodiment of RF receiver 312, low-noise amplifier 604 has a variable gain that is responsive to a control signal received from AGC 522 (e.g., analog gain control signal, $\alpha_1$). In at least one embodiment of RF receiver 312, other modules introduce a variable gain in addition to, or instead of the variable gain applied by low-noise amplifier 604. For example, filters 613 and 615 (which may be variable gain programmable filters or include separate filters 612, and 614 and variable gain amplifiers 616 and 618) introduce a variable gain that is responsive to a control signal received from AGC 522 (e.g., analog gain control signal, $\alpha_2$). However, the variable gain may be introduced by other modules of RF receiver 312 or in other locations of the receiver path of RF receiver 312. Although circuits and signals of RF receiver 312 are shown as being differential signals, other embodiments of RF receiver 312 are adapted to accommodate single-ended signaling techniques.

Referring back to FIG. 3, in at least one embodiment of node 102, although the received signal is amplified in RF receiver 312 (which includes analog circuitry), application of gain in the analog portions of the receiver path is not sufficient to maintain voltage levels of the received signal in a target range of the receiver dynamic range over the entire receiver data path. For example, in at least one embodiment of node 102, if the received signal voltage levels are sufficiently close to the limits of the dynamic range of the receiver, a total amount of gain to be applied to the received signal may be greater than a maximum amount of gain that RF receiver 312 is designed to apply to the received signal. Accordingly, in at least one embodiment of node 102, in addition to an analog gain introduced to the received signal by RF receiver 312, receiver 308 (which includes digital signal processing modules) applies a digital gain to samples of the received signal responsive to one or more digital control signals received from AGC 522 (e.g., digital gain control signal, $\alpha_3$).

Referring back to FIG. 5, a gain may be applied digitally at one or more locations in the receive signal path of receiver 308 using a separate gain module (e.g., digital gain 503) or by incorporating the gain function into another module of receiver 308. For example, in an embodiment of receiver 308, $\alpha_3$ is received by RX filters 504, which apply a gain to the received signal based on the value of $\alpha_3$. In other embodiments of receiver 308, one or more digital gains are applied at one or more corresponding locations of the receiver path prior to demapping (e.g., by one or more separate gain modules inserted in the receiver path or one or more of filters 504, high-pass filter 506, I/Q balance module 508, timing interpolator 510, de-rotator 512, cyclic prefix removal module 514, or other module included in the receiver path prior to demapper 542). In at least one embodiment of receiver 308, the gain may be applied using a two's complement shift of samples of the received signal by a number of bits indicated by the gain control signal value or by a digital multiply of a gain value with samples of the received signal.

Figure 7:
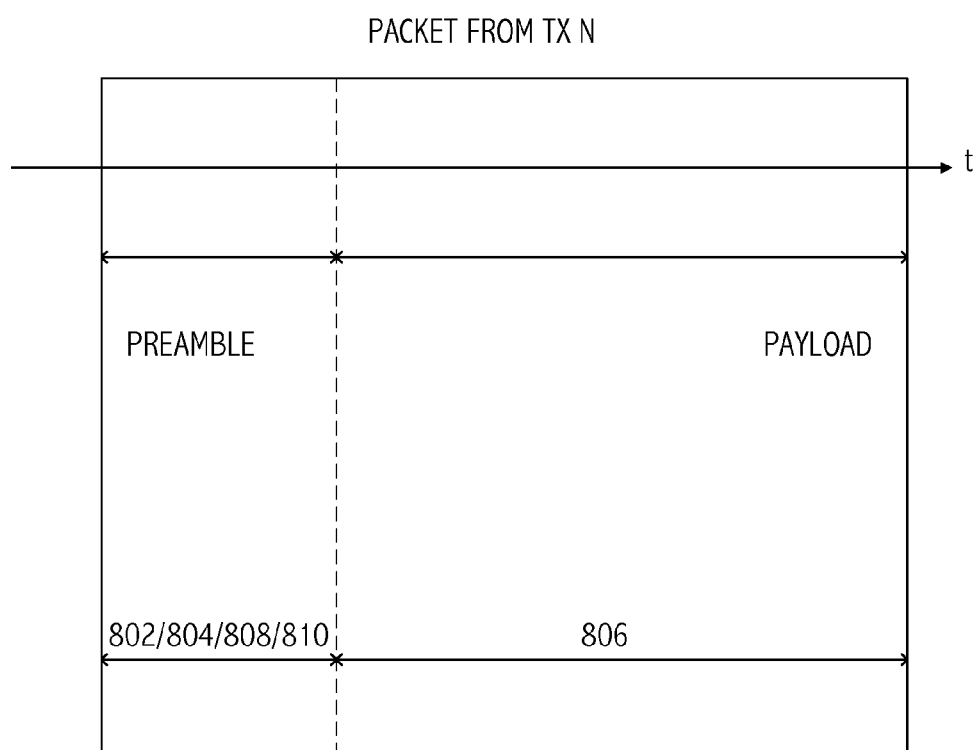
FIG. 7 illustrates a structure of an exemplary packet consistent with at least one embodiment of the invention.
Figure 8:
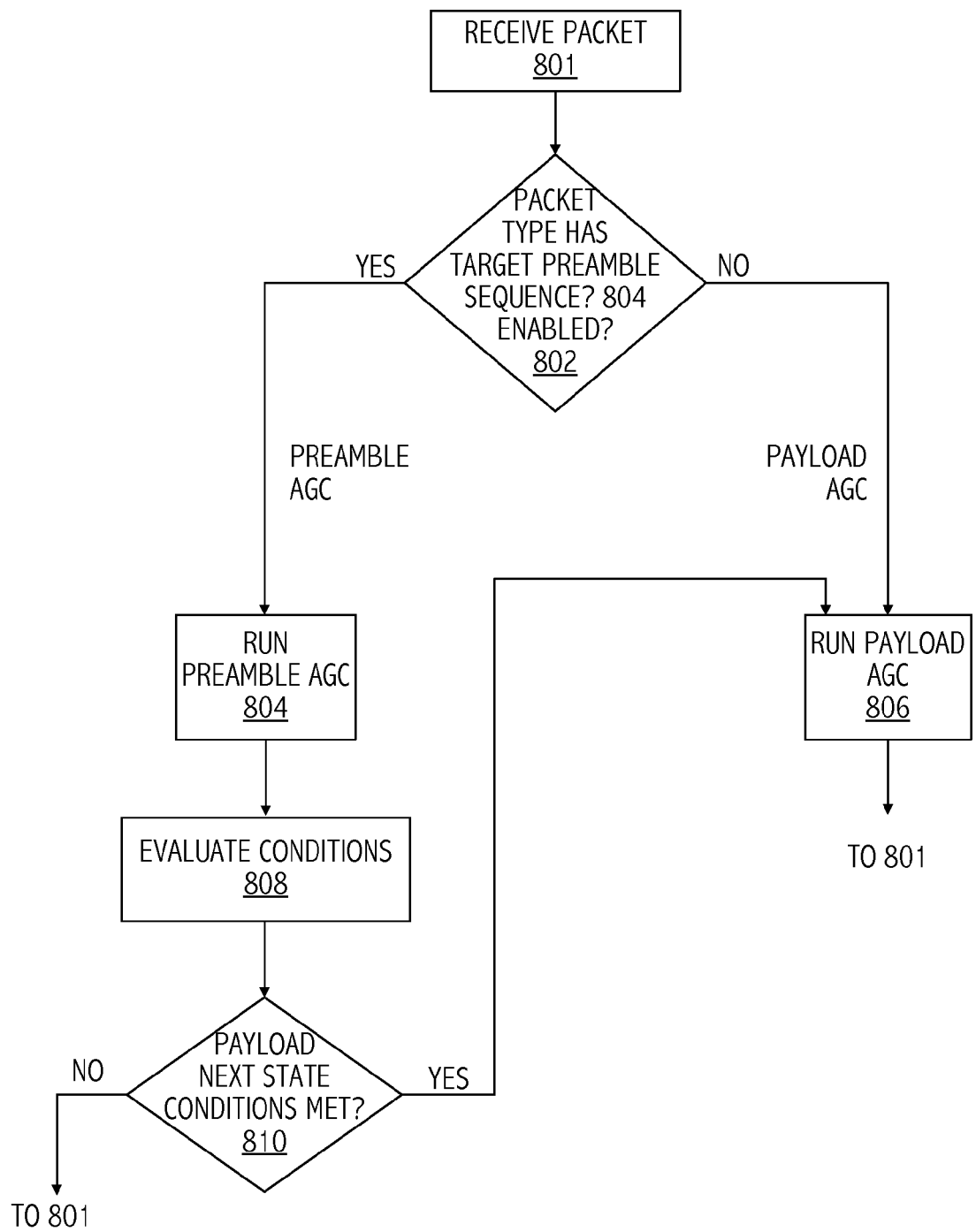
FIG. 8 illustrates information and control flows for an automatic gain control technique consistent with at least one embodiment of the invention.
Figure 9A:
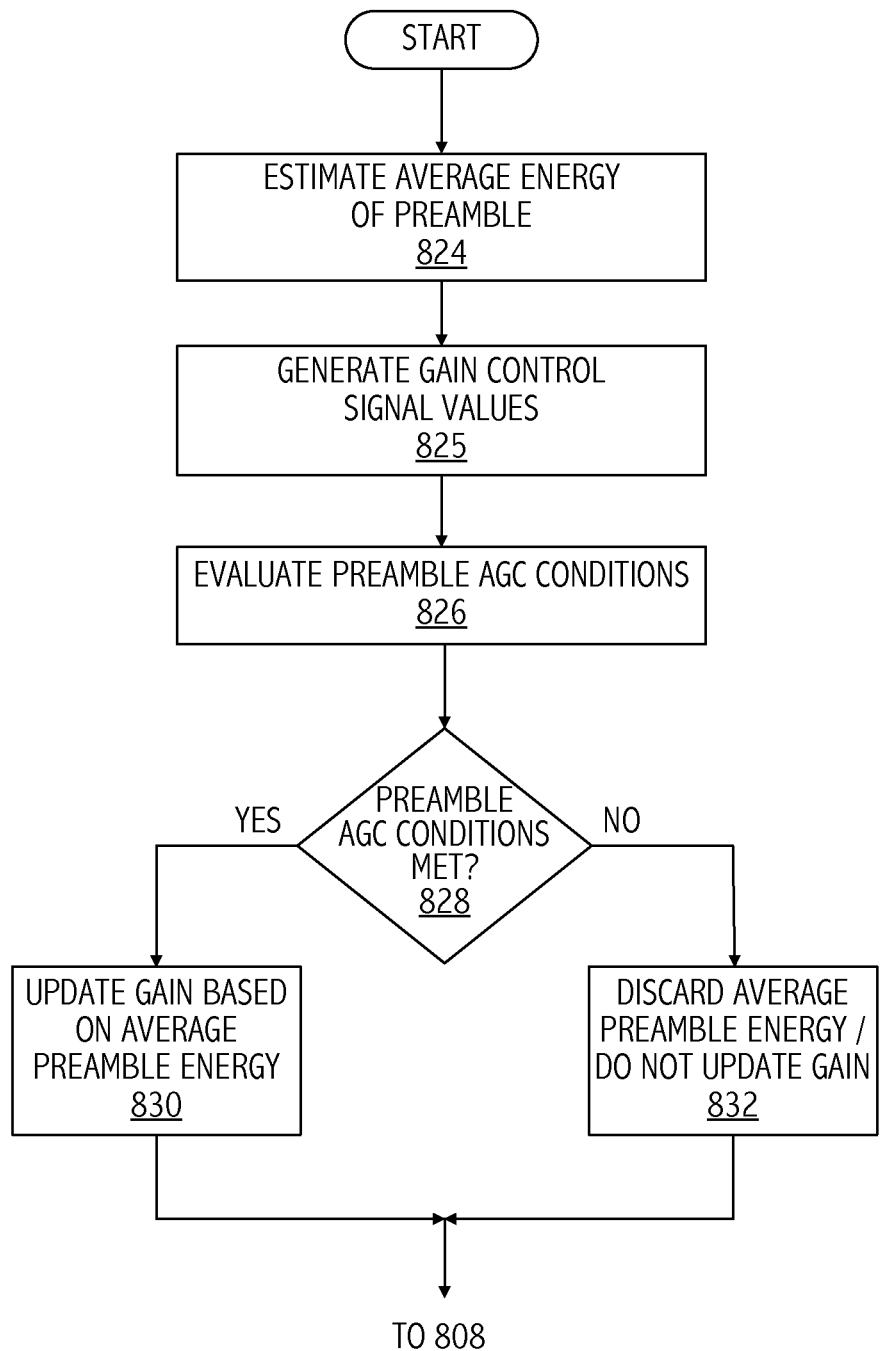
FIGS. 9A and B illustrate information and control flows for a preamble AGC technique of FIG. 8, consistent with at least one embodiment of the invention.
Figure 9B:
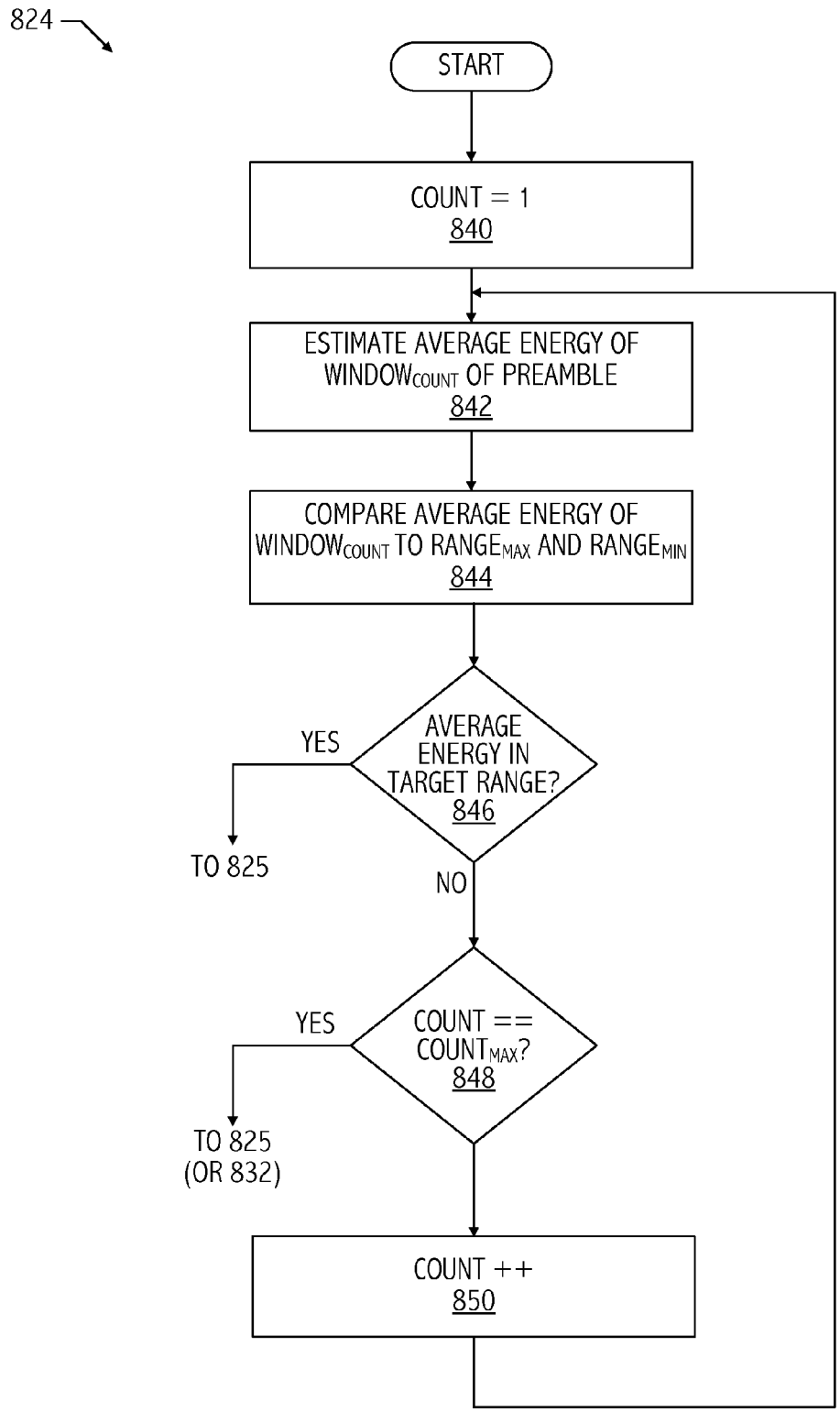

Referring to FIG. 7, in a typical packet-based communications system, data packets include a header or preamble portion and a payload portion. In general, the preamble portion facilitates delivery of the payload, which is the part of the transmitted data that is the purpose of the transmission. A receiving node demodulates a payload portion of a received data packet to recover data from a received signal, which is a digital version of a signal received from a transmitting node over a channel. Referring back to FIG. 5, AGC 522 generates one or more gain control signals based on preamble portions of a packet and adjusts those one or more gain control signals based on payload portions of a packet.

Referring to FIGS. 2, 5, 8, 11A and 11B, in at least one embodiment of the gain control technique, receiver 308 receives a packet over a particular link (e.g., a packet from a transmitter of node 108) (801). AGC controller 701 evaluates the received signal and a set of conditions to determine a next state of AGC 522 (802), i.e., whether to perform a preamble AGC technique 804 or to perform payload AGC technique 806, both of which are described further below. For example, AGC controller 701 determines a type of the received packet (e.g., based on contents of the received signal). If AGC controller 701 determines that the packet has a type that includes a known, predetermined sequence in the preamble (e.g., a relatively short sequence of symbols including a symbol generated using a pseudorandom number generator and repeated over the length of the sequence), then AGC 522 performs preamble AGC technique 804. However, in at least one embodiment of AGC controller 701, that decision is based on one or more other conditions in addition to the presence of the known, predetermined sequence in the received signal. For example, if preamble AGC technique 804 has recently executed successfully for that particular link, then AGC controller 701 determines whether to skip or otherwise disable preamble AGC technique 804 based on a predetermined setting or based on other criterion. If AGC controller 701 determines that the packet type is a type not including the predetermined sequence, or preamble AGC technique 804 is disabled or other suitable condition exists, then AGC controller 701 determines that the next state after receiving at least a portion of a packet is to begin payload AGC technique 806. Upon completion of payload AGC technique 806, AGC controller 701 awaits an indicator of receipt of a next packet (801).

If AGC controller 701 determines that the next state after receiving at least a portion of a packet is to execute preamble AGC technique 804, upon completion of preamble AGC technique 804, AGC controller 701 evaluates any next state conditions (808). In at least one embodiment, AGC controller 701 automatically configures AGC 522 to execute payload AGC technique 806 after completion of preamble AGC technique 804. In at least one embodiment, AGC controller 701 conditionally configures AGC 522 to execute payload AGC technique 806 after completion of preamble AGC technique 804 based on one or more of the following: an indication of payload sample detection, an indication of a successful preamble detection, indication of successful timing acquisition, packet type, or other suitable indicator (808). In at least one embodiment, the condition includes a wait time (e.g., implemented using a counter that indicates a number of samples, symbols, or packets) between iterations of AGC payload 806, since an implemented gain adjustment may not be realized immediately between energy estimates of AGC 522. Once payload AGC technique 806 completes, then AGC controller 701 awaits an indicator of receipt of a next packet (801). If the payload AGC next state condition(s) are not satisfied during a packet (810), then AGC controller 701 returns to the state that awaits an indicator of receipt of a next packet (801).

In at least one embodiment of AGC 522, with regard to a particular channel or link, AGC 522 performs the preamble AGC technique 804 before ever performing the payload AGC technique 806. For example, a transmitting node associated with the link will send a first type of packet (e.g., beacon packet) including the predetermined sequence before sending other types of packets. Thus, AGC 522 performs the preamble AGC technique 804 before payload AGC technique 806. AGC 522 may execute preamble AGC technique 804 on any received packet that includes the known, predetermined sequence. The known, predetermined sequence includes data, known by the receiver and that is generated in time domain at the transmitting node. The known, predetermined sequence is used to determine an average energy over a predetermined window size, as described further below. AGC 522 may execute payload AGC technique 806 on any packet with a payload to update the one or more gain values generated in preamble AGC technique 804.

Referring to FIGS. 5, 9A, 9B, 11A, and 11B, when AGC 522 executes preamble AGC technique 804, AGC 522 estimates an average energy of the preamble (824). For example, AGC 522 generates a magnitude squared of individual time domain samples of the received signal (e.g., $|s[n]|^2$) corresponding to the known, predetermined sequence of the preamble. The individual time domain samples may be obtained from any block of receiver 308 prior to FFT 516 of FIG. 5. In at least one embodiment, RF receiver 312 is a differential architecture, and time domain samples are obtained from a location in the path of receiver 308 prior to I/Q balance 508. In at least one embodiment, RF receiver 312 is a single-ended architecture and time domain samples are obtained from a location in the receive path of receiver 308 after compensation by I/Q balance 508. In at least one embodiment of AGC 522, the number of time domain samples used is programmable. For example, the predetermined sequence includes a periodic sequence of samples repeated a predetermined number of times and the energy window is programmed to have a length of the repeated sequence, although other suitable window lengths may be used. The magnitude squared values for each of the samples of the energy window are summed to generate a frame energy estimate (e.g., $E_t$). Since the energy window is a sliding window having the length of the repeated sequence, the energy estimate is approximately the same starting at any sample of the repeated sequence.

In at least one embodiment, the number of times AGC 522 executes at least a portion of preamble AGC technique 804 for a particular packet is programmable. If the energy window of samples selected from the preamble includes one or more silence samples and some preamble samples, the gain computed by AGC 522 may degrade performance of the receiver. However, if preamble AGC technique 804 estimates the average energy for multiple windows of preamble samples, until the energy estimate is in a target energy range or an execution count is reached, that degradation can be reduced or eliminated. For example, referring to FIG. 9B, when AGC 522 estimates the average energy of preamble (824), an execution counter is initialized (840). AGC 522 then estimates the average energy of a window of average energy of preamble samples in samples of the preamble corresponding to that count value (i.e., $WINDOW_{COUNT}$) (842). AGC controller 701 compares the average energy estimate corresponding to $WINDOW_{COUNT}$ to limits of the average energy range (e.g., $RANGE_{MAX}$ and $RANGE_{MIN}$, which are predetermined and may be programmable). If the average energy estimate corresponding to $WINDOW_{COUNT}$ is within the target energy range, then AGC 522 generates gain control signal values based on that average energy estimate (825). If the average energy estimate corresponding to $WINDOW_{COUNT}$ is not within the target energy range, but the maximum number of times to run this portion of the preamble AGC technique 804 has been reached, then AGC 522 generates gain control signal values based on that average energy estimate (825). In another embodiment of AGC 522, if the average energy estimate corresponding to $WINDOW_{COUNT}$ is not within the target energy range, and the maximum number of times to run this portion of the preamble AGC technique 804 has been reached (848), then AGC controller 701 discards the estimate and does not update the gain (832). If the average energy estimate corresponding to $WINDOW_{COUNT}$ is not within the target energy range, but the maximum number of times to run this portion of the preamble AGC technique 804 has not been reached, then AGC controller 701 increments the counter (850) and estimates the average energy of a next window of samples of the preamble corresponding to that next count value (842).

Referring to FIGS. 5, 9A, 11A, and 11B, gain conversion module 706 generates one or more gain signal values based on that energy estimate or an average energy estimate based on the energy estimate. For example, gain conversion module 706 compares the average energy estimate to a predetermined target average energy value. The target average energy value is selected to achieve signal levels that have sufficient margin from the limits of the dynamic range of the receiver (e.g., ADC 502 and/or other module of the receiver). For example, if the average energy is 0.5 and the target average energy value is 1.0, gain conversion module 706 generates one or more gain control signals that request a gain of 1.0/0.5=2, or $10 \times \log_{10}(2) \approx 3$ dB. Gain conversion module 706 converts this gain to settings for one or more circuits of RF receiver 312 and/or receiver 308 (i.e., one or more of $\alpha_1$, $\alpha_2$, and $\alpha_3$). In at least one embodiment, gain conversion module 706 generates the one or more gain control signal levels based on a lookup table stored in memory (e.g., gain table 705), which contains gain control signal values indexed by average energy estimate level, or by performing a mapping to gain control signal levels as a function of the average energy estimate (825). In at least one embodiment, gain conversion module 706 generates one or more gain control signal values based on the sum of the magnitude squared values, e.g., by obtaining one or more gain control signal values corresponding to a sum value from a lookup table stored in memory (e.g., gain table 705) or by performing a mapping as a function of the sum (825).

In at least one embodiment of preamble AGC technique 804, AGC 522 unconditionally implements the one or more gain control signal values generated based on the average preamble energy (e.g., by writing to suitable storage elements within receiver 308 and/or RF receiver 312 that implement the corresponding gains and/or by writing to appropriate storage elements of storage device 704, which store the one or more gain control signal values associated with a particular link N) (830). In at least one embodiment of preamble AGC technique 804, the one or more gain values are conditionally implemented by writing those gain control signal values to the corresponding modules of RF receiver 312 and/or receiver 308 and/or storage device 704 (830). For example, AGC controller 701 evaluates one or more preamble AGC conditions (826), including one or more of the following: an indication of preamble detection, an indication of timing acquisition timeout, any indicator that the preamble may not have been sufficiently decoded, any other indicator that the packet structure is not as expected (e.g., an extra sequence in the preamble), or an indication that the preamble AGC has previously executed a predetermined number of times for the particular transmitting node. If the specified combination of preamble AGC conditions is satisfied (828), then AGC 522 implements the gain associated with the one or more gain control signal values (830). If the combination of the preamble AGC conditions is not satisfied (828), then AGC 522 does not implement the gain associated with the one or more gain control signal values and effectively discards the average preamble energy value and/or associated gain control signal values (832).

Figure 10:
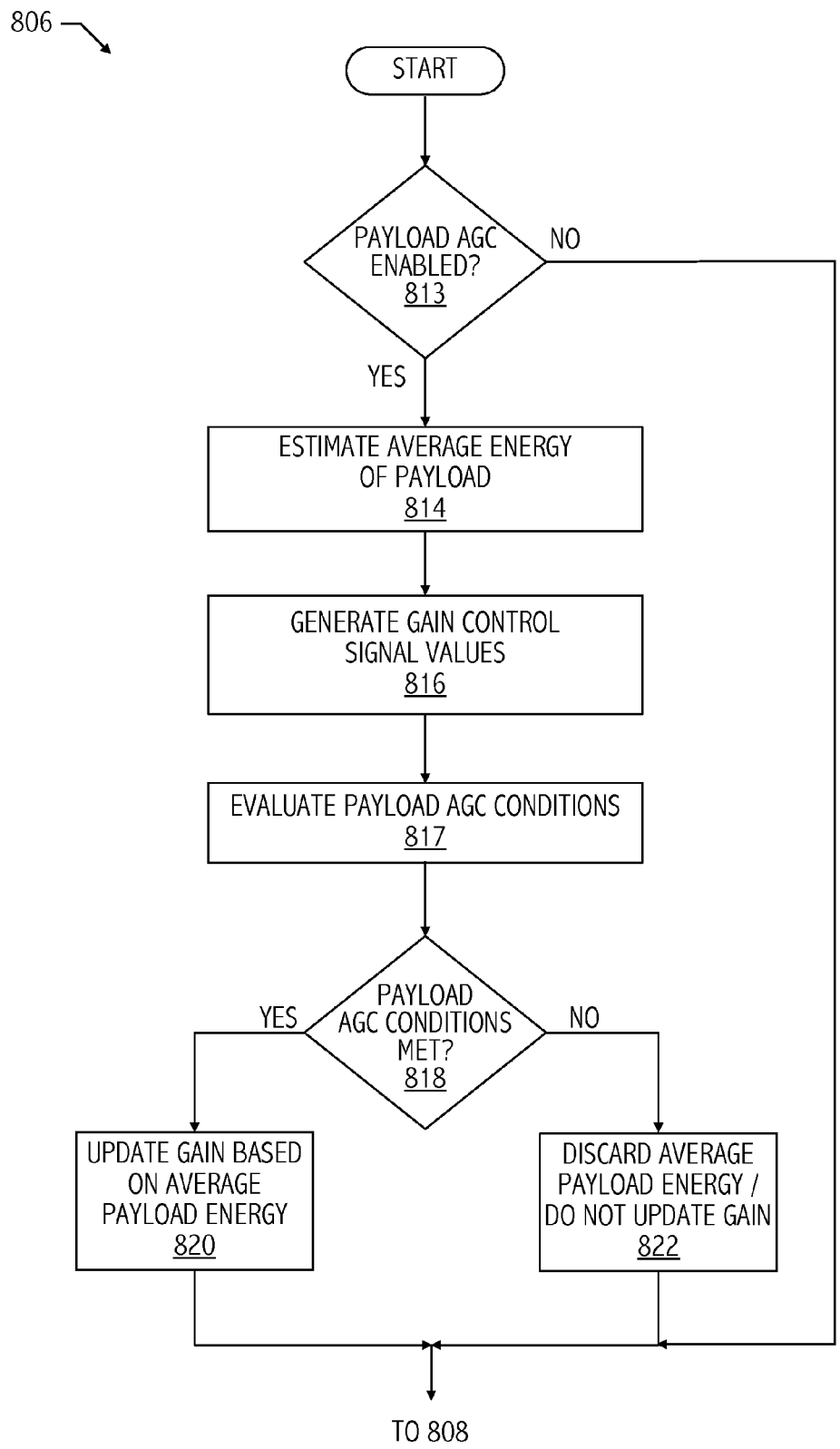
FIG. 10 illustrates information and control flows for a payload AGC technique of FIG. 8, consistent with at least one embodiment of the invention.
Figure 11A:
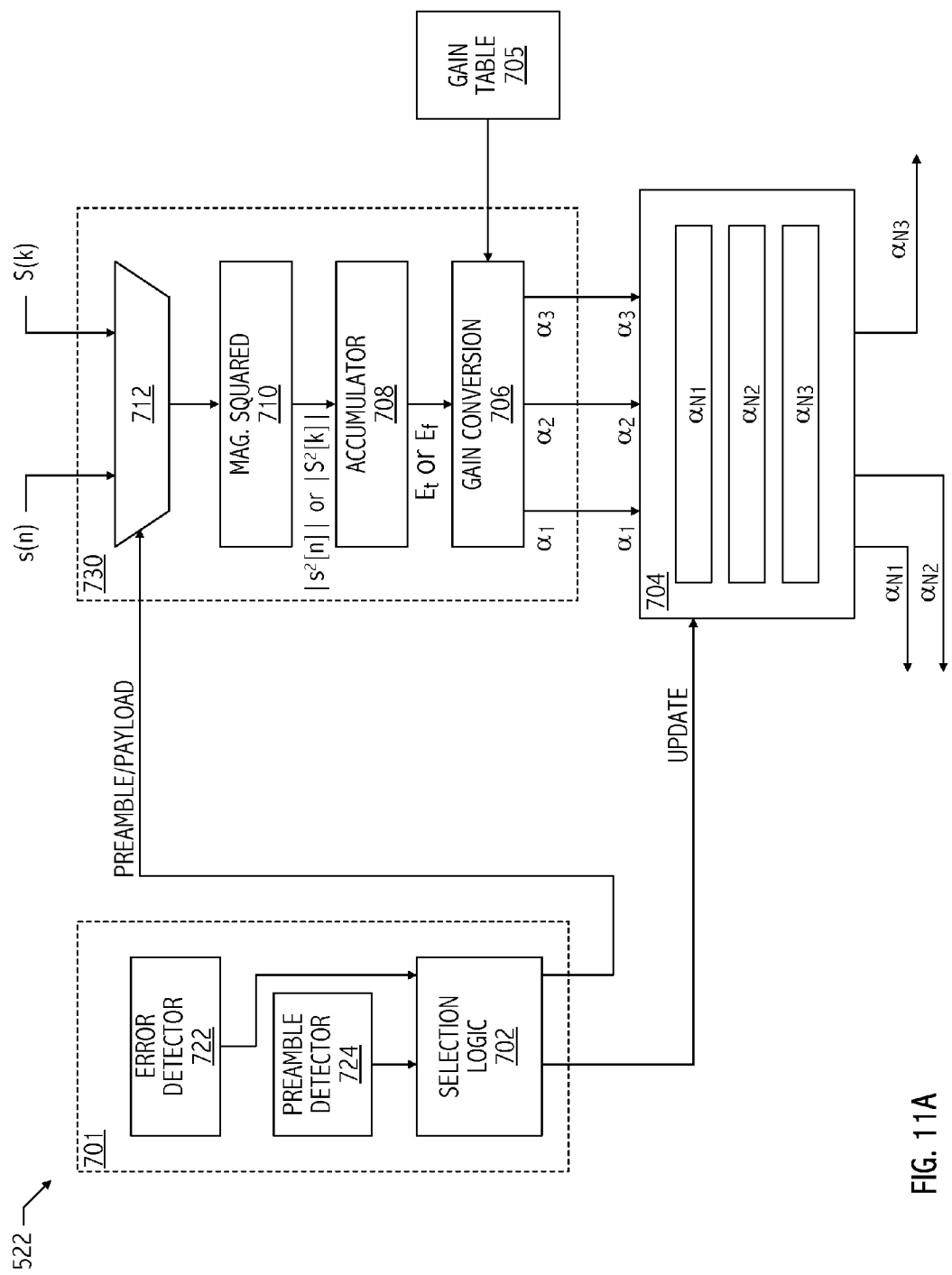
FIGS. 11A and 11B illustrate functional block diagrams of exemplary automatic gain control modules consistent with at least one embodiment of the invention.
Figure 11B:
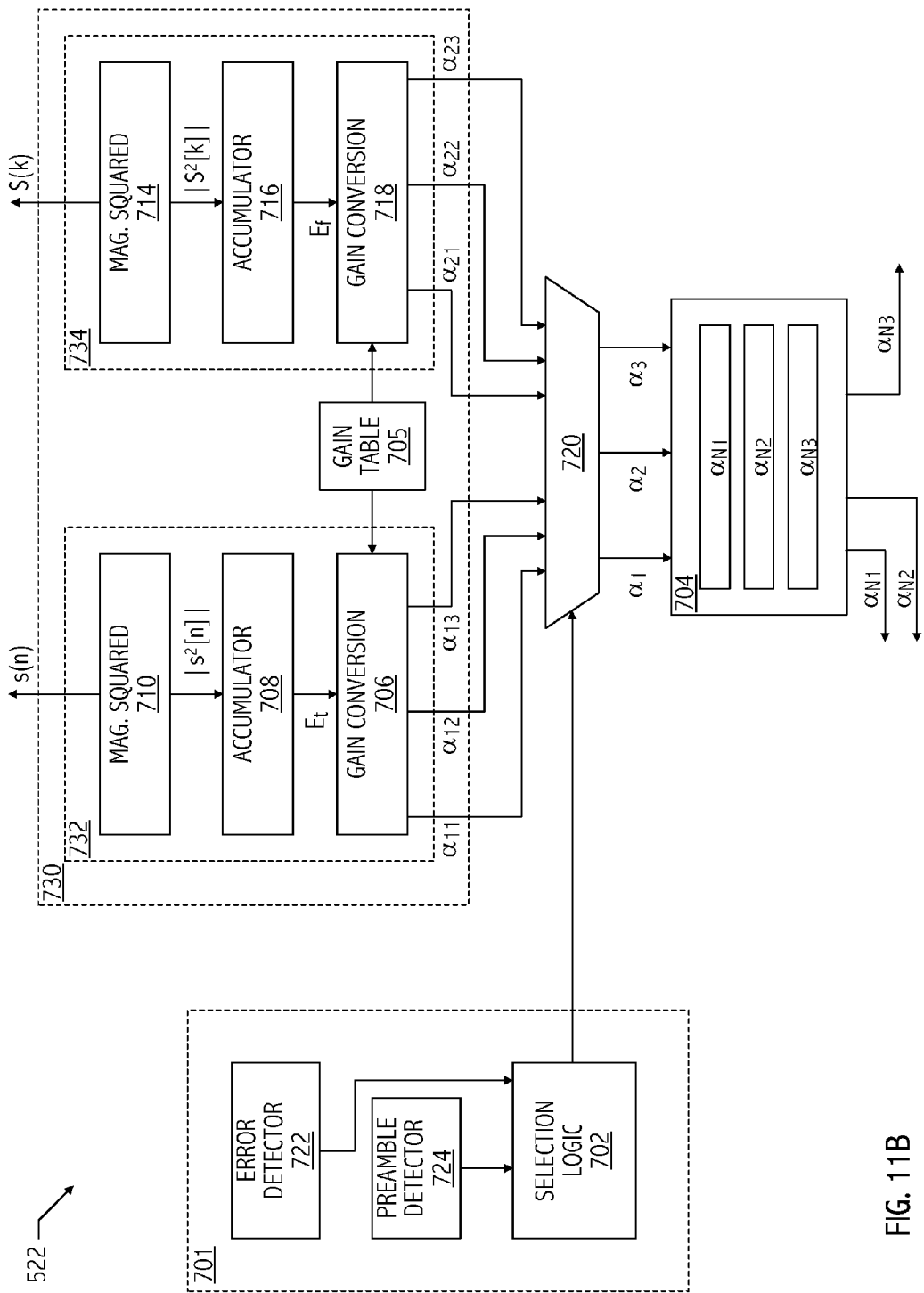

Referring to FIGS. 10, 11A and 11B, in at least one embodiment, when AGC 522 executes payload AGC technique 806, AGC determines whether the payload AGC is enabled. If the payload AGC is not enabled, then AGC 522 awaits an indicator of receipt of a next packet (801). If the payload AGC is enabled (813), then AGC 522 estimates an average energy in the payload (814). For example, AGC 522 computes a magnitude squared of individual frequency domain samples (e.g., $|S[k]|^2$) corresponding to at least a portion of the payload of the received packet. The individual frequency domain samples may be obtained from any block of receiver 308 after FFT 516 of FIG. 5, but prior to demapper 542. That is, the individual frequency domain samples processed by payload AGC technique 806 are frequency domain samples of the demodulated received signal, each sample corresponding to a subcarrier of an OFDM symbol. The magnitude squared values for each of the frequency domain samples are summed for a predetermined number of samples (e.g., at least some or all of the subcarriers of one or more OFDM symbol) of the payload to generate an energy estimate (e.g., $E_f$). The data carried by the subcarriers is not previously known by receiver 308. In general, the OFDM sequence looks random with average energy of one over an FFT frame. In at least one embodiment, payload AGC 806 has control over which portions of the frequency spectrum the one or more gain control signal values are based. For example, if payload AGC technique 806 generates the energy estimate based on frequency domain samples prior to frequency domain equalization (e.g., prior to FEQ 546), some subcarriers may be ignored to reduce or eliminate distortion or clipping. In at least one embodiment of AGC 522, only those subcarriers that are bit loaded are used. If payload AGC 806 generates the energy estimate based on frequency domain samples after frequency domain equalization (e.g., after FEQ 546), energy in all subcarriers is considered.

In at least one embodiment of payload AGC technique 806, gain conversion module 706 generates an average energy value based on the magnitude squared of the frequency domain samples and generates one or more gain control signal values based on the average energy estimate, e.g., by obtaining one or more gain control signal values corresponding to the energy estimate from a lookup table stored in memory (e.g., gain table 705) or by performing a mapping as a function of the average energy estimate (816). In at least one embodiment, gain conversion module 706 generates one or more gain control signal values based on the sum of the magnitude squared values, e.g., by obtaining one or more gain control signal values corresponding to the sum from a lookup table stored in memory (e.g., gain table 705) or by performing a mapping as a function of the sum (816).

In at least one embodiment of payload AGC technique 806, the gain corresponding to the one or more gain control signal values is unconditionally implemented by the appropriate modules of receiver 308 and/or RF receiver 312. For example, AGC 522 writes suitable storage elements within receiver 308 and/or RF receiver 312 that implement the gain corresponding to the one or more gain control signal values and/or writes to appropriate storage elements of storage device 704, which store the one or more gain control signal values associated with a particular transmitting node (820). In at least one embodiment of payload AGC technique 806, the gain corresponding to the one or more gain control signal values is conditionally implemented. For example, AGC controller 701 evaluates payload AGC conditions (817), which include one or more of the following: an indication of payload sample detection, an indication of a number of payload samples received, an indication of payload cyclic redundancy check (CRC) results, an indication of timing acquisition timeout, any other indicator that the payload has not been sufficiently decoded, any other indicator that the packet structure is not as expected, and/or the number of times payload AGC technique 806 executed. In at least one embodiment of AGC 522, the number of times AGC 522 executes payload AGC technique 806 for a particular link is programmable. If a specified set of the payload AGC conditions is satisfied (818), then AGC 522 implements the gain associated with the gain control signal values (820). In at least one embodiment of payload AGC technique 806, if timing acquisition completes, which indicates that the payload is being properly decoded, but a CRC fails (818), AGC 522 implements the specified gain (820). If the combination of the payload AGC conditions is not satisfied (818), then AGC 522 maintains the current gain and associated gain control signal values without updating and discards the average energy value and/or associated gain control signal values (822). Note that the sequence of operations illustrated in FIGS. 8, 9A, 9B, and 10 are exemplary only. Techniques consistent with the description herein may perform operations in other orders consistent with any data dependencies of FIGS. 8, 9A, 9B, and 10

Referring to FIG. 11A, in at least one embodiment, AGC 522 includes a shared data path (e.g., data path 730) for computing the one or more gain control signal values by each of the preamble AGC technique 804 and payload AGC technique 806. Accordingly, AGC controller 701 selects which samples (e.g., samples from a time domain portion of receiver 308 or samples from a frequency domain portion of receiver 308) are used in the computation based on the state of AGC 522 using a selecting circuit (e.g., select circuit 712). Magnitude squared module 710 generates the magnitude squared of the selected samples (e.g., $|s[n]|^2$ or $|S[k]|^2$), which are then accumulated by accumulator 708 to generate a corresponding energy estimate (e.g., $E_t$ or $E_f$, respectively) and provides the corresponding energy estimate to gain conversion module 706. Gain conversion module 706 of the shared data path generates a single set of gain control signal values (e.g., one or more of $\alpha_1$, $\alpha_2$, and $\alpha_3$), which are selectively stored in storage 704, storage devices of receiver 308, and/or storage devices of RF interface 312 according to an update indicator generated by selection logic 702 and based on inputs received from error detector 722 and preamble detector 724 of AGC controller 701 and/or other circuitry, consistent with satisfaction of one or more conditions described above.

Referring to FIG. 11B, in at least one embodiment, AGC 522 includes separate data paths (e.g., data path 732 and data path 734), for computing the gain control signal values by preamble AGC technique 804 and payload AGC technique 806, respectively. Each of data paths 732 and 734 generates a separate set of one or more gain control signal values. Magnitude squared module 710 generates the magnitude squared of the time domain samples (e.g., $|s[n]|^2$), which are then accumulated by accumulator 708 to generate a corresponding energy estimate (e.g., $E_t$) and provides the corresponding energy estimate to gain conversion module 706. Gain conversion module 706 of the data path 732 generates a set of gain control signal values (e.g., one or more of $\alpha_{11}$, $\alpha_{12}$, and $\alpha_{13}$). Magnitude squared module 714 generates the magnitude squared of the frequency domain samples (e.g., $|S[k]|^2$) which are then accumulated by accumulator 716 to generate a corresponding energy estimate (e.g., $E_f$) and provides the corresponding energy estimate to gain conversion module 718. Gain conversion module 718 of the data path 734 generates a set of gain control signal values (e.g., one or more of $\alpha_{21}$, $\alpha_{22}$, and $\alpha_{23}$). AGC controller 701 selects which set of the one or more gain control signal values are selectively provided (e.g., as one or more of $\alpha_1$, $\alpha_2$, and $\alpha_3$) to storage 704, storage elements of receiver 308, and/or storage elements of RF interface 312 by select circuit 720 according to an update indicator generated by selection logic 702 based on inputs received from error detector 722 and preamble detector 724 of AGC controller 701, or other circuitry consistent with satisfaction of one or more conditions described above.

In at least some embodiments, the gain control signal values indicate total gain adjustments, i.e., a gain control signal value indicates a gain adjustment that corresponds to a replacement of a prior gain level. For example at least one of $\alpha_1$, $\alpha_2$, and $\alpha_3$ are absolute gain adjustments that correspond to a gain level that replaces a prior gain level. In at least some embodiments, the gain control signal values indicate gain change adjustments, i.e., a new gain value applied in RF interface 312 and receiver 308 is based on the old gain value and a change value having a predetermined step size. For example at least one of $\alpha_1$, $\alpha_2$, and $\alpha_3$ are increases or decreases of predetermined sizes to a prior gain value applied by RF receiver 312 and/or receiver 308.

In general, AGC 522 configures RF receiver 312 and/or receiver 308 to apply a gain to a received signal that results in the received signal having a target signal level. For example, the target signal level, e.g., a signal level in the middle of the dynamic range of the receiver path, reduces or eliminates effect of noise distortion and/or clipping. In at least one embodiment of AGC 522, preamble AGC technique 804 always runs on a first packet from a particular transmitting node. Conditions ensure that the one or more gains implemented by preamble AGC technique 804 are robust and result in one or more gain control signal values that achieve a received signal level that is close enough to a target signal range that packets can be decoded. The one or more gains control signal values implemented by payload AGC technique 806 improve the signal-to-noise ratio of the received packet. In general, the payload AGC technique improves gains that were applied by the preamble AGC technique. In at least one embodiment of AGC 522, payload AGC runs over multiple packets and the gain control signal values converge to values that achieve target signal levels.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which a receiver receives communications over a channel including coaxial cable, one of skill in the art will appreciate that the teachings herein can be utilized with devices consistent with other OFDM communications protocols and/or other wireline or wireless channels. Variations and modifications of the embodiments disclosed herein, may be made based on the description set forth herein, without departing from the scope and spirit of the invention as set forth in the following claims.

What is claimed is:

1. A method comprising:
   receiving a payload portion of a received packet based on a gain control signal having a first value; and
   selectively adjusting the gain control signal to have a second value, the second value being based on the payload portion of the received packet, the selectively adjusting comprising:
      generating an update indicator in response to a payload detection indicator based on the received packet and an error detection indicator based on decode of the payload portion of the received packet;
      generating the second value based on frequency domain samples of the payload portion of the received packet, the first value being based on time domain samples of a preamble portion of a second received packet; and
      adjusting the gain control signal to have the second value in response to the update indicator.

2. The method, as required by claim 1, further comprising:
   generating the first value based on the preamble portion of the second received packet.

3. The method, as required by claim 2, wherein generating the first value comprises:
   determining the first value based on the time domain samples of the preamble portion of the second received packet.

4. The method, as required by claim 2, wherein the received packet and the second received packet are the same packet.

5. The method, as required by claim 2, wherein the payload portion of the received packet includes previously unknown data and the preamble portion of the second received packet includes previously known data.

6. The method, as required by claim 1, further comprising:
   determining the second value based on at least one frequency domain symbol of the payload portion of the received packet.

7. The method, as required by claim 1, wherein the adjusting the gain control signal to have the second value is in response to the error indicator indicating an absence of an error condition.

8. The method, as required by claim 1, wherein the selectively adjusting comprises:
   maintaining the gain control signal at the first value in response to the error detection indicator indicating an error in the decode of the payload portion.

9. The method, as required by claim 1, wherein the detection indicator is based on a number of received symbols of the payload portion equaling a number of expected symbols.

10. The method, as required by claim 1, wherein the error detection indicator indicates an absence of an error condition in response to timing acquisition completing for the received packet and a cyclic redundancy check associated with the payload portion failing.

11. The method, as required by claim 1, wherein the error detection indicator is based on an indicator of a timeout condition.

12. The method, as required by claim 1, wherein the gain control signal comprises an analog gain control signal and a digital gain control signal, wherein the method further comprises:
   providing the analog gain control signal to a receiver interface circuit; and
   providing the digital gain control signal to a digital signal processing circuit.

13. The method, as required by claim 1, wherein the second value is based on a demodulated symbol of the payload portion of the received packet.

14. The method, as recited in claim 1, wherein selectively adjusting comprises
   generating the error detection indicator based on the payload portion of the received packet; and
   generating the payload detection indicator based on the received packet.

15. A receiver comprising:
   a receiver interface circuit;
   a gain generation circuit configured to generate a gain signal having a first value based on time domain samples of a preamble portion of a packet received using the receiver interface circuit and configured to generate the gain signal having a second value based on frequency domain samples of a payload portion of a second packet received using the receiver interface circuit;
   a control circuit configured to generate an update indicator based on detection of the payload portion of the second packet and an error indicator based on the payload portion of the second packet; and
   a selection circuit configured to provide the second gain value as an update to the gain signal having the first value in response to the update indicator.

16. The receiver, as recited in claim 15, further comprising:
   a demodulator configured to generate a frequency domain symbol based on the payload portion of the second packet, wherein the second value is based on the frequency domain symbol.

17. The receiver, as required by claim 15, wherein the packet and the second packet are the same packet.

18. The receiver, as recited in claim 15, wherein the selection circuit provides the second gain value in response to the timing acquisition completing and a fail of a cyclic redundancy check of a payload portion of the second packet.

19. The receiver, as recited in claim 15, wherein the gain signal includes the analog gain signal and the digital gain value and the receiver interface circuit comprises:
   an analog portion configured to generate an analog baseband signal in response to a radio frequency analog signal and an analog gain signal;
   an analog-to-digital converter circuit configured to convert the analog baseband signal into a digital baseband signal, and
   a digital portion configured to recover data from packets of the digital baseband signal based on a digital gain signal.

20. An apparatus comprising:
   means for receiving packets; and
   means for selectively adjusting a gain of the means for receiving to have one of a first value and a second value, the first value being based on time domain samples of a preamble portion of a packet received by the receiving means and the second value being based on frequency domain samples of a payload portion of a second packet received by the receiving means,
   wherein the means for selectively adjusting provides the second value to the means for receiving as an update to the gain having a first value in response to detection of the payload portion of the second packet and an absence of an error in decode of the payload portion of the second packet.

* * * * *

UNITED STATES PATENT AND TRADEMARK OFFICE
CERTIFICATE OF CORRECTION

PATENT NO. : 9,184,942 B2
APPLICATION NO. : 13/346055
DATED : November 10, 2015
INVENTOR(S) : Cheng-Chou Lan and Cimarron Mittelsteadt Page 1 of 1

It is certified that error appears in the above-identified patent and that said Letters Patent is hereby corrected as shown below:

In the Claims

Column 17, in claim 9, line 51, please add --error-- after "wherein the";

Column 18, in claim 14, line 7, please insert --:-- after "comprises";

Column 18, in claim 19, line 40, Approximately, please replace "includes the" with --includes an-- and replace "and the" with --and a--;

Column 18, in claim 19, line 44, Approximately, please replace "an" with --the--.

Signed and Sealed this
Twelfth Day of April, 2016

Michelle K. Lee
*Director of the United States Patent and Trademark Office*

UNITED STATES PATENT AND TRADEMARK OFFICE
CERTIFICATE OF CORRECTION

PATENT NO. : 9,184,942 B2
APPLICATION NO. : 13/346055
DATED : November 10, 2015
INVENTOR(S) : Cheng-Chou Lan and Cimarron Mittelsteadt It is certified that error appears in the above-identified patent and that said Letters Patent is hereby corrected as shown below:

In the Claims

Column 17, line 51, please add --error-- after "wherein the";

Column 18, line 7, please insert --:-- after "comprises";

Column 18, line 40, please replace "includes the" with --includes an-- and replace "and the" with --and a--;

Column 18, line 44, please replace "an" with --the--.

This certificate supersedes the Certificate of Correction issued April 12, 2016.

Signed and Sealed this
Third Day of May, 2016

Michelle K. Lee
*Director of the United States Patent and Trademark Office*